United States Patent
Kim

(10) Patent No.: US 7,329,556 B2
(45) Date of Patent: Feb. 12, 2008

(54) HIGH-SENSITIVITY IMAGE SENSOR AND FABRICATION METHOD THEREOF

(75) Inventor: Hoon Kim, Yongin-si (KR)

(73) Assignee: Korean Electronics Technology Institute (KR)

( * ) Notice: Subject to any disclaimer, the term of this patent is extended or adjusted under 35 U.S.C. 154(b) by 224 days.

(21) Appl. No.: 11/024,787

(22) Filed: Dec. 30, 2004

(65) Prior Publication Data

US 2006/0148142 A1    Jul. 6, 2006

(51) Int. Cl.
*H01L 21/00*    (2006.01)
*H01L 21/425*    (2006.01)
*H01L 31/062*    (2006.01)
*H01L 31/113*    (2006.01)

(52) U.S. Cl. ......... 438/57; 257/290; 257/292; 257/294; 438/48; 438/514

(58) Field of Classification Search ...... None
See application file for complete search history.

(56) References Cited

U.S. PATENT DOCUMENTS

| | | | | |
|---|---|---|---|---|
| 5,901,257 | A | 5/1999 | Chen et al. | 382/312 |
| 6,020,581 | A | 2/2000 | Dennard et al. | 250/208.1 |
| 6,127,697 | A | 10/2000 | Guidash | 257/292 |
| 6,380,037 | B1 | 4/2002 | Osanni | 438/294 |
| 6,380,572 | B1 * | 4/2002 | Pain et al. | 257/292 |
| 6,700,144 | B2 * | 3/2004 | Shimazaki et al. | 257/292 |
| 7,061,031 | B1 * | 6/2006 | Kim | 257/222 |
| 7,075,165 | B2 * | 7/2006 | Leon et al. | 257/458 |
| 7,160,753 | B2 * | 1/2007 | Williams, Jr. | 438/73 |
| 7,233,036 | B1 * | 6/2007 | Hsu et al. | 257/290 |

OTHER PUBLICATIONS

Korean Search Report on Korean app. No. 1020030087286, dated Aug. 16, 2005 & patent granted decision Aug. 22, 2005.*
Korean Search Report on Korean app. No. 1020030087324, dated Aug. 16, 2005 & patent granted decision Aug. 22, 2005.*
U.S. Appl. No. 11/024,783 to Kim, filed Dec. 30, 2004.

* cited by examiner

*Primary Examiner*—Andy Huynh
*Assistant Examiner*—Hoang-Quan Ho
(74) *Attorney, Agent, or Firm*—Greenblum & Bernstein, P.L.C.

(57) ABSTRACT

A method of fabricating a high-sensitivity image sensor and the same are disclosed. The disclosed method comprises: etching predetermined regions of active silicon and a buried oxide layer of a SOI substrate by using a mask to expose an N-type silicon substrate; implanting P-type ions into the exposed N-type silicon substrate to form P-type regions; forming a gate oxide layer and a gate electrode on the middle part of the active silicon not etched while the active silicon is etched to expose the N-type silicon substrate; forming a P-type gate electrode, and P-type source and drain regions by implanting P-type ions into the active silicon and the gate electrode above the buried oxide layer; and constructing a connection part to connect the P-type regions to the gate electrode. The disclosed high-sensitivity sensor comprises: a photodiode region having a PN junction between an N-type silicon substrate and a P-type region thereon; a monocrystalline silicon region from a SOI substrate in which source and drain regions, and a channel are placed, having a distance to the photodiode region; a gate oxide layer and a gate electrode on the silicon region; and a connection part connecting the P-type region of the photodiode to the gate electrode.

5 Claims, 11 Drawing Sheets

US 7,329,556 B2

HIGH-SENSITIVITY IMAGE SENSOR AND FABRICATION METHOD THEREOF

BACKGROUND OF THE INVENTION

1. Field of the Invention

The present invention relates to an image sensor and, more particularly, to a high-sensitivity image sensor embodied on a silicon-on-insulator (hereinafter referred to as "SOI"), achieving a high sensitivity and a high degree of integration.

2. Background of the Related Art

Referring to FIG. 1a, an image sensor generally has stacked structure comprising a P-type silicon substrate 1 and an N-type silicon substrate 2 formed by epitaxial growth. The stacked structure also includes a photodiode 3 and a bipolar transistor 4 that functions as a circuit for processing a signal produced from the photodiode 3. The N-type silicon substrate is divided into plural regions by P-type buried diffusion layers 5. The photodiode 3 and the bipolar transistor 4 are provided in or on the plural regions of the N-type silicon substrate.

The photodiode 3 is constructed by using a PN junction that is an interface between the P-type silicon substrate 1 and the N-type silicon substrate 2. The bipolar transistor 4 has a P-type diffusion layer in the upper part of the N-type silicon substrate 2. An $N^+$-type diffusion layer 7 is placed from the surface of the N-type silicon substrate 2 to the upper part of the P-type silicon substrate 1.

An oxide layer 6 is provided on the entire surface of the N-type silicon substrate 2. For the bipolar transistor, metal interconnects are connected to the $N^+$-type diffusion layer 7, and the P-type diffusion layer. The photosensitivity of this type of the photodiode depends on the photosensitivity of the PN junction as well as the absorption amount influenced by the size and the thickness of the photodiode.

FIG. 1b is a cross-sectional view illustrating an image sensor on an SOI wafer. The SOI wafer comprises a P-type silicon substrate 11 and an N-type silicon substrate 12 under which an N-type diffusion layer 19 is placed. An oxide layer 13 is positioned between the P-type silicon substrate 11 and the N-type diffusion layer 19.

The N-type silicon substrate 12 is divided into plural regions by trench-type isolation layers 14. A photodiode 15 and a bipolar transistor 16 are provided in or on the plural regions of the N-type silicon substrate 12. The trench-type isolation layers 14 extend from an oxide layer 17 positioned on the $N^-$type silicon substrate 12 to the upper part of the oxide layer 13.

For the photodiode 15, a P-type diffusion layer which acts as an active layer, is positioned near the surface of the N-type silicon substrate 12. An $N^+$-type diffusion layer 18 extends from the surface of N-type silicon substrate 12 to the N-type diffusion layer 19.

A conventional CMOS image sensor using a bulk silicon substrate has a technical limitation in terms of the improvement of sensitivity and a noise characteristic, and the possibility that light-excited carriers can be created in undesirable region by light irradiation always remains. Furthermore, a presence of parasitic stray capacitance causes an increment of a noise and the degradation of operation speed, so that a characteristic of the sensor is deteriorated. In detail, for the CMOS image sensor using a bulk silicon substrate, a dark current component, which is a type of leakage current generated when a depletion region of an intrinsic semiconductor is formed toward the substrate, works as a noise component of a photo-current. Such a characteristic decreases sensitivity of the sensor and a response speed of the photo-current, so that a response speed to an incoming image gets to fall.

Moreover, for the CMOS image sensor using a conventional SOI substrate, an epitaxial silicon layer placed on a buried oxide layer is so thin that an operation of a high voltage transistor is difficult.

SUMMARY OF THE INVENTION

Accordingly, the present invention is directed to a high sensitivity image sensor and fabrication method thereof that substantially obviates one or more problems due to limitations and disadvantages of the related art.

An object of the present invention is to provide a method of fabricating a high-sensitivity image embodied on an SOI, achieving a high sensitivity and a high degree of integration.

Another object of the present invention is to provide a high-sensitivity image sensor having a high sensitivity and a high degree of integration.

To achieve these objects and other advantages and in accordance with the purpose of the invention, as embodied and broadly described herein, a first method of fabricating a high-sensitivity image sensor comprises: etching predetermined regions of active silicon and a buried oxide layer of a SOI substrate by using a mask to expose an N-type silicon substrate; implanting P-type ions into the exposed N-type silicon substrate to form P-type regions; forming a gate oxide layer and a gate electrode on the middle part of the active silicon not etched while the active silicon is etched to expose the N-type silicon substrate; forming a P-type gate electrode, and P-type source and drain regions by implanting P-type ions into the active silicon and the gate electrode above the buried oxide layer; and constructing a connection part to connect the P-type regions to the gate electrode. A first high-sensitivity sensor comprises: a photodiode region having a PN junction between an N-type silicon substrate and a P-type region thereon; a monocrystalline silicon region from a SOI substrate in which source and drain regions, and a channel are placed, having a distance to the photodiode region; a gate oxide layer and a gate electrode on the silicon region; and a connection part connecting the P-type region of the photodiode to the gate electrode.

To achieve these objects and other advantages and in accordance with the purpose of the invention, as embodied and broadly described herein, a second method of fabricating a high-sensitivity image sensor comprises: etching a first region of active silicon and a buried oxide layer of a SOI substrate by using a mask to expose an N-type silicon substrate; growing the exposed N-type silicon substrate to form an active silicon passage; etching a second region of the active silicon and the buried oxide layer at a distance to the first region to expose the N-type silicon substrate; implanting P-type ions into the second region of the exposed N-type silicon substrate to form P-type regions; forming a gate oxide layer and a gate electrode on the active silicon passage; forming source and drain regions by implanting P-type ions into a predetermined region including the first region except the second region; and connecting the P-type regions of the N-type silicon substrate positioned under the lateral faces of a transistor comprising the source and drain regions, and the gate electrode to the gate electrode. A second high-sensitivity sensor comprises: a photodiode region having a PN junction between an exposed N-type substrate by etching a predetermined region of active silicon and a buried oxide layer, and a P-type region thereon; a passage connecting the N-type silicon substrate at a distance to the photodiode region to a channel region of a floating body; a gate oxide layer and a gate electrode on the channel region of the floating body; and a connection part connecting two photodiodes under the lateral faces of the floating body to the gate electrode.

To achieve these objects and other advantages and in accordance with the purpose of the invention, as embodied and broadly described herein, a third method of fabricating a high-sensitivity image sensor comprises: etching a first region of active silicon and a buried oxide layer a SOI substrate by using a mask to expose an N-type silicon substrate; growing the exposed N-type silicon substrate to form an active silicon passage; etching a second region of the active silicon and the buried oxide layer at a distance to the first region to expose the N-type silicon substrate; implanting P-type ions into the second region of the exposed N-type silicon substrate to form P-type regions; forming a gate oxide layer and a gate electrode on the active silicon passage; forming source and drain regions by implanting P-type ions into a predetermined region including the first region except the second region; and connecting the P-type regions of the N-type silicon substrate positioned under the lateral faces of a transistor comprising the source and drain regions, and the gate electrode to AC voltage. A third high-sensitivity sensor comprises: a photodiode region having a PN junction between an exposed N-type substrate by etching a predetermined region of active silicon and a buried oxide layer, and a P-type region thereon; a passage connecting the N-type silicon substrate at a distance to the photodiode region to a channel region of a floating body; a gate oxide layer and a gate electrode on the channel region of the floating body; and a connection part for applying the AC voltage to two photodiodes under the lateral faces of the floating body.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Three examples for embodying a high-sensitivity image sensor are as follows.

Figure 1A:
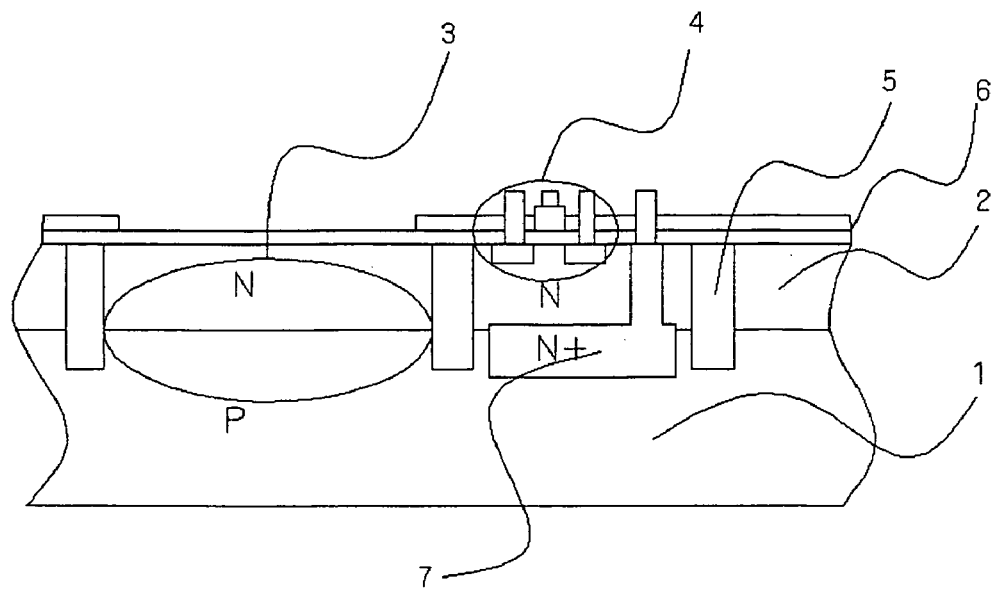
FIGS. 1a and 1b are image sensors fabricated in accordance with the prior art.
Figure 1B:
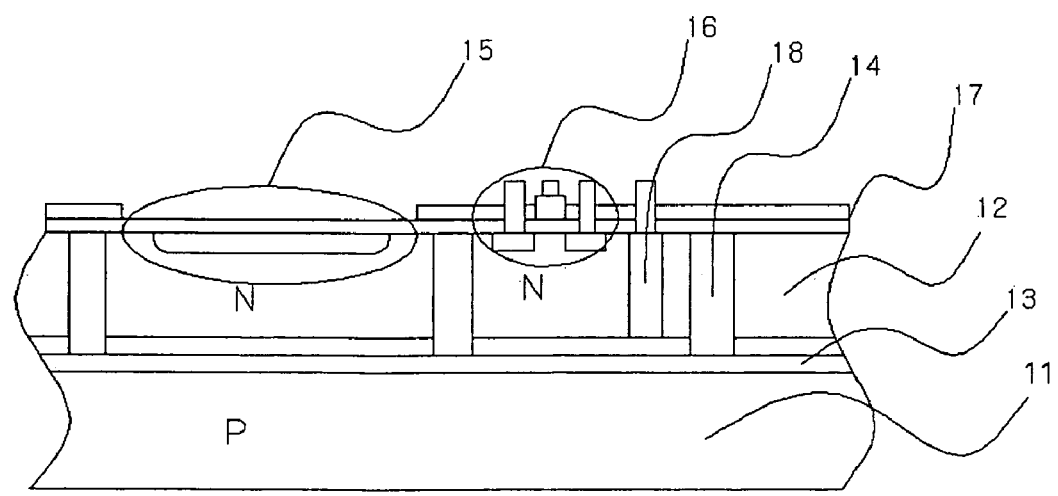
Figure 2A:
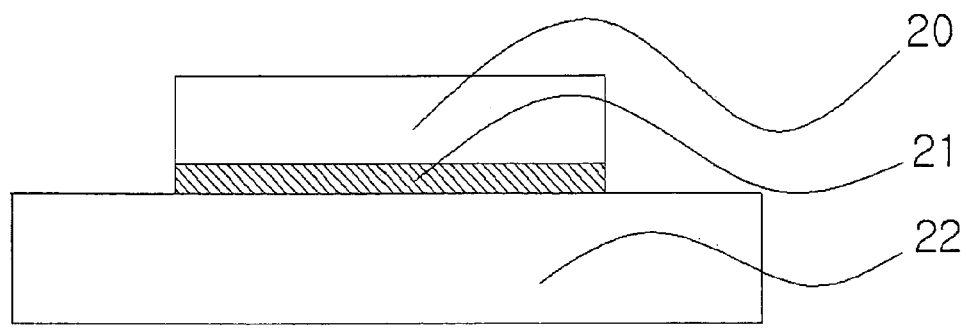
FIGS. 2a through 2e are cross-sectional views illustrating the first example process of fabricating a high-sensitivity image sensor in accordance with the present invention.

As the first example, referring to FIG. 2a, predetermined regions of active silicon 20 and a buried oxide layer 21 are etched by using a mask over an SOI substrate to expose an N-type silicon substrate 22. The SOI substrate can be manufactured according to various kind of fabrication methods. Particularly for the SOI substrate manufactured by means of a separation by implanted oxygen (hereinafter referred to as "SIMOX") method, the active silicon on the buried oxide layer is monocrystalline. The active silicon has a predetermined thickness so as to accomplish a fully depleted layer when an external voltage is applied to it.

Figure 2B:
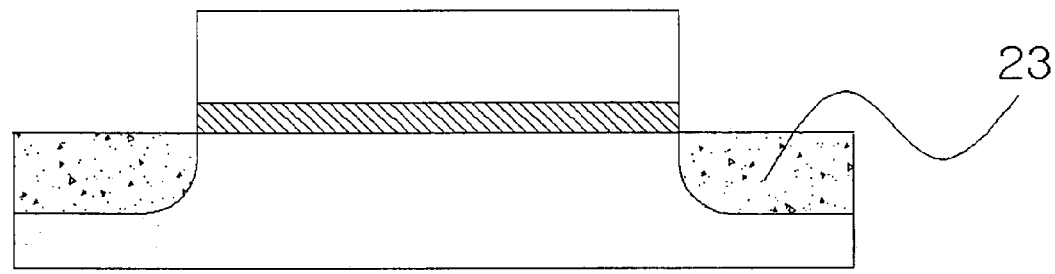

Referring to FIG. 2b, P-type ions are implanted into the exposed N-type silicon substrate 22 to form P-type regions 23, so that a PN junction is completed. A photodiode is defined by the PN junction. The ion implantation is conducted to a sufficient depth for ensuring that irradiated light is converted to photoelectrons as much as possible. In addition, the shape of the photodiode is preferably buried-type so that a dark current can be minimized.

Figure 2C:
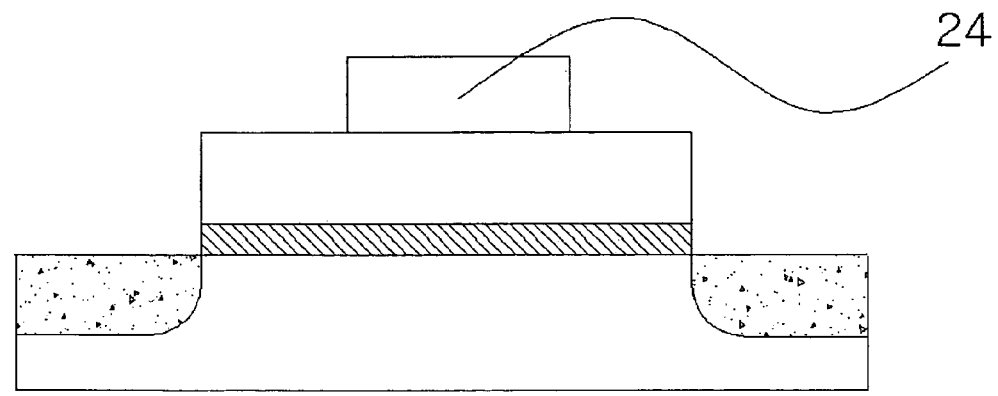

Referring to FIG. 2c, after a gate oxide layer(not shown) and a silicon layer are sequentially provided on the middle part of the active silicon, a gate electrode 24 is completed by patterning and etching the gate oxide layer and the silicon layer. The gate electrode 24 has a narrower width than that of the active silicon so that source and drain regions can be placed in the active silicon under the lateral faces of the gate electrode 24.

Figure 2D:
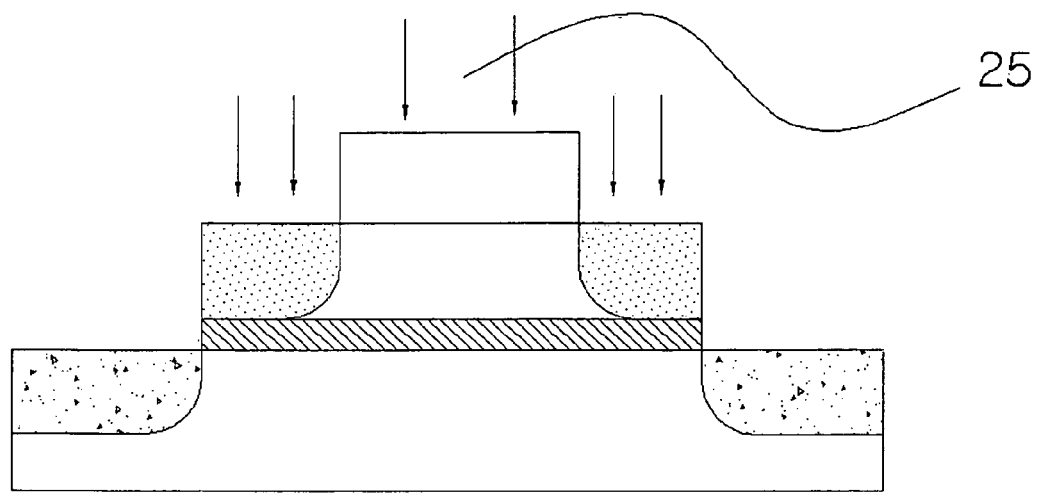

Referring to FIG. 2d, a P-type gate electrode, and P-type source and drain regions are formed by implanting P-type ions 25 into the active silicon and the gate electrode above the buried oxide layer. At the same time, a channel region is defined under the P-type gate electrode between the P-type source and drain regions. P-type regions of the photodiode, and the P-type source and drain regions are formed by different process steps so that the type of the photodiode in accordance with the present invention, such as buried-type, provides a good efficiency.

Figure 2E:
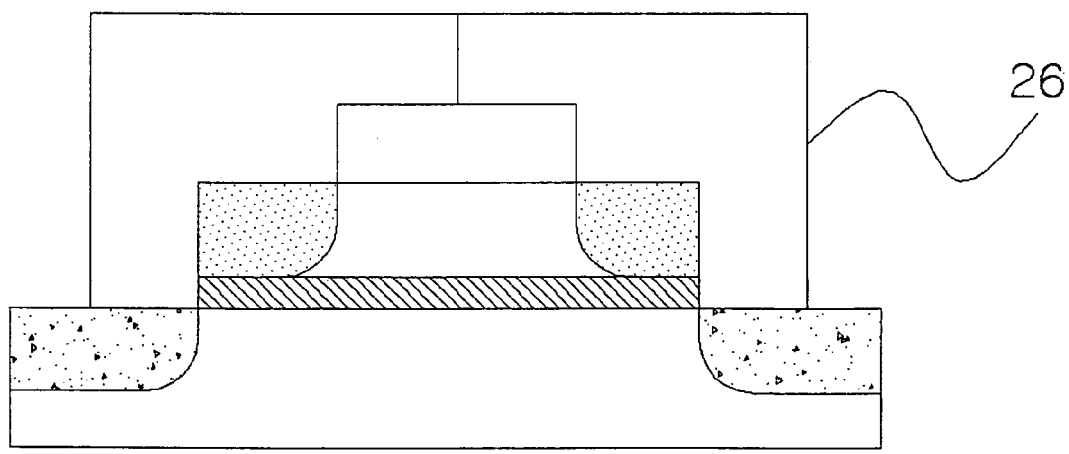

Referring to FIG. 2e, a connection part 26 is constructed to connect the P-type regions of the photodiode to the gate electrode. The connection part 26 functions as a path so that holes excited by light irradiation move to the gate electrode.

Figure 2F:
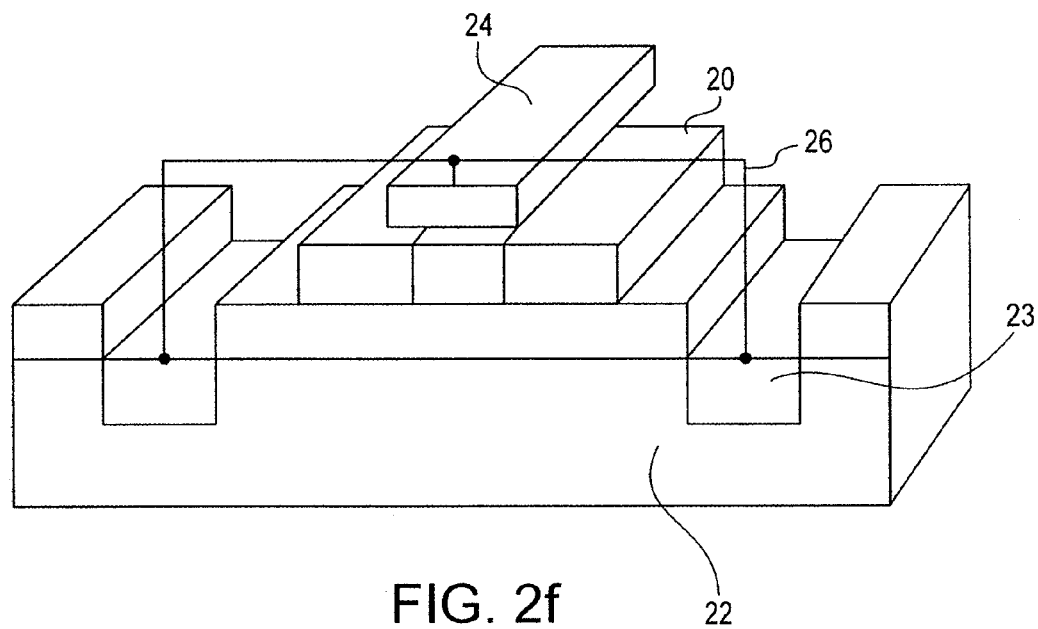
FIG. 2f illustrates the structure of a high-sensitivity image sensor in accordance with the present invention.

Referring to FIG. 2f, photodiode regions are shown, having the PN junctions between the P-type regions 23 of the photodiode and the N-type silicon substrate 22. The active silicon 20 and the gate electrode 24 thereon are also presented. The P-type regions 23 of the photodiode and the gate electrode 24 are tied to the connection part 26.

Figure 2G:
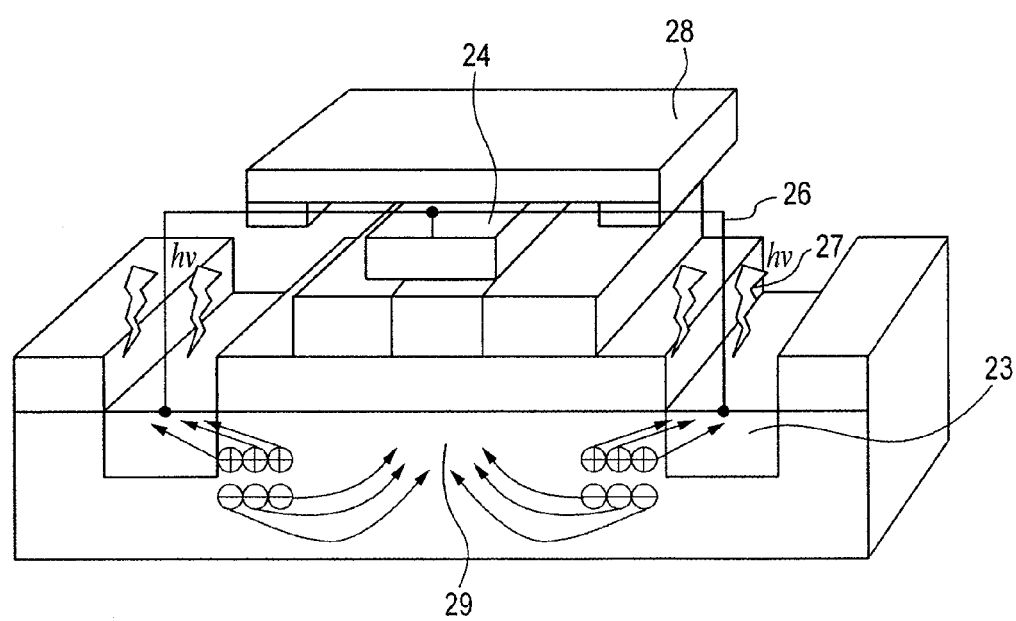
FIG. 2g is a cross-sectional view illustrating the operation principle of a high-sensitivity image sensor in accordance with the present invention.

FIG. 2g is a cross-sectional view illustrating the operation principle of a high-sensitivity image sensor in accordance with the present invention. Light irradiation 27 is conducted on the photodiode regions. A light shield screen 28 is provided over the gate electrode 24 and the source and drain regions to prevent light from being irradiated on the region except for the photodiode regions. The light shield screen 28 is preferably made of Al. Electron-hole pairs are created in the photodiode by the light irradiation. The holes move along the P-type regions 23 of the photodiode and the connection part 26, so that the holes are accumulated in the gate electrode 24. The electrons move along the N-type substrate and are accumulated in the middle part 29 of the N-type substrate below the buried oxide layer.

Accordingly, if a certain amount of the holes are accumulated in the gate electrode, electric field of the channel region under the gate electrode is increased, so that the channel region becomes a fully-depleted layer and photocurrent from the fully depleted layer becomes induced. Moreover, since body potential of a field effect transistor (hereinafter referred to as "FET") to light-excited carriers is linearly increased, a threshold voltage of the FET is adjustable, so that photoresponse is increased. Furthermore, as a PNP lateral bipolar transistor (hereinafter referred to as "LBT") is constructed by the electrons accumulated in the middle part 29 of the N-type substrate and operates, so that much more photocurrent is induced.

Figure 3A:
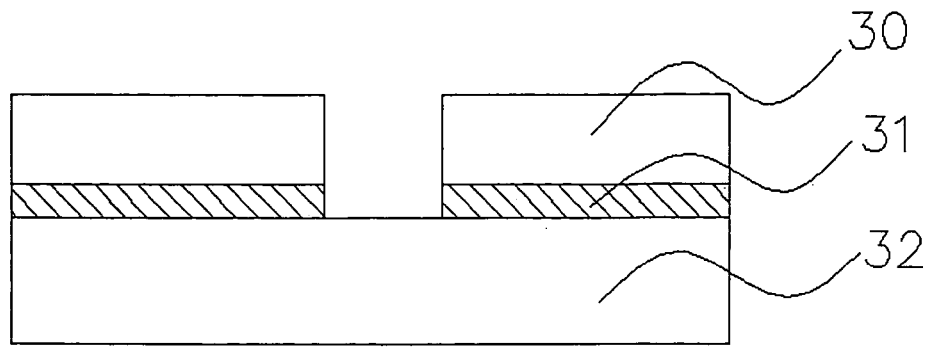
FIGS. 3a through 3g are cross-sectional views illustrating the second example process of fabricating a high-sensitivity image sensor in accordance with the present invention.

As the second example, referring to FIG. 3a, a first region of active silicon 30 and a buried oxide layer 31 are etched by using a mask over an SOI substrate to expose an N-type silicon substrate 32. The SOI substrate can be manufactured according to various kind of fabrication methods. Particularly, the SOI substrate manufactured by an SIMOX method has a characteristic that the active silicon on the buried oxide layer is monocrystalline.

Figure 3B:
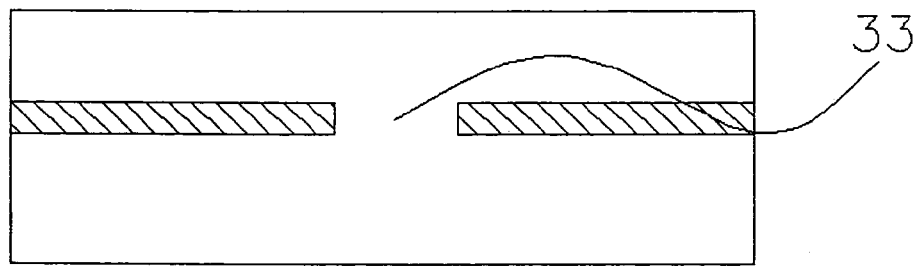

Referring to FIG. 3b, the exposed N-type silicon substrate is grown to form an active silicon passage 33 that connects the N-type silicon substrate to active silicon on the buried oxide layer. The active silicon passage is grown with a doping concentration equal to that of the N-type silicon substrate.

Figure 3C:
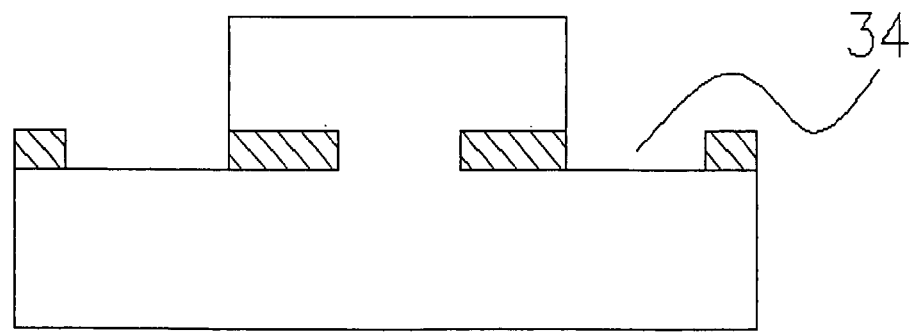

Referring to FIG. 3c, a second region 34 of the active silicon 30 and the buried oxide layer 32 at a distance to the first region are etched to expose the N-type silicon substrate. The second region 34 is etched so that a sufficient area of a photodiode is obtained.

Figure 3D:
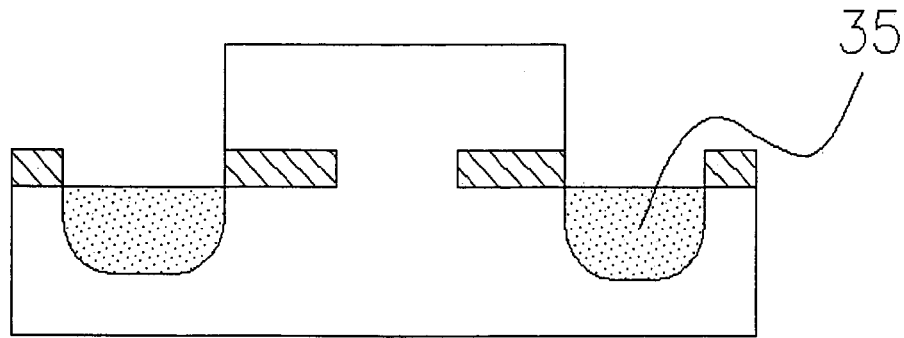

Referring to FIG. 3d, P-type ions are implanted into the second region 34 of the exposed N-type silicon substrate to form P-type regions 35, so that PN junctions are completed. Two photodiodes are defined by the PN junctions. The ion implantation is conducted to a sufficient depth for ensuring that irradiated light is converted to photoelectrons as much as possible. In addition, the shape of the photodiode is preferably buried-type so that a dark current can be minimized.

Figure 3E:
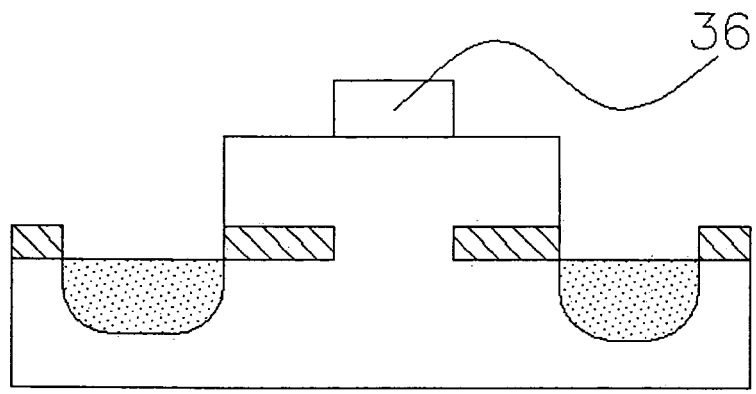

Referring to FIG. 3e, after a gate oxide layer and a silicon layer for a gate electrode are sequentially provided over the active silicon passage 33, the gate electrode 36 is completed by etching the gate oxide layer and the silicon layer.

Figure 3F:
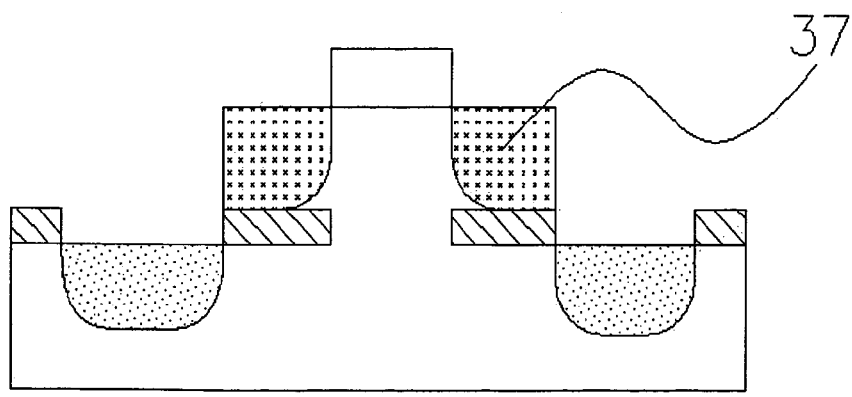

Referring to FIG. 3f, source and drain regions 37 are formed by implanting P-type ions into regions under the lateral faces of the gate electrode 36. At the same time, a region under the gate electrode between the source and drain regions is defined as a channel region. When a pattern for the ion implantation is constructed, regions for the gate electrode, and the source and drain regions are exposed. However, the region for the gate electrode may be not exposed.

Figure 3G:
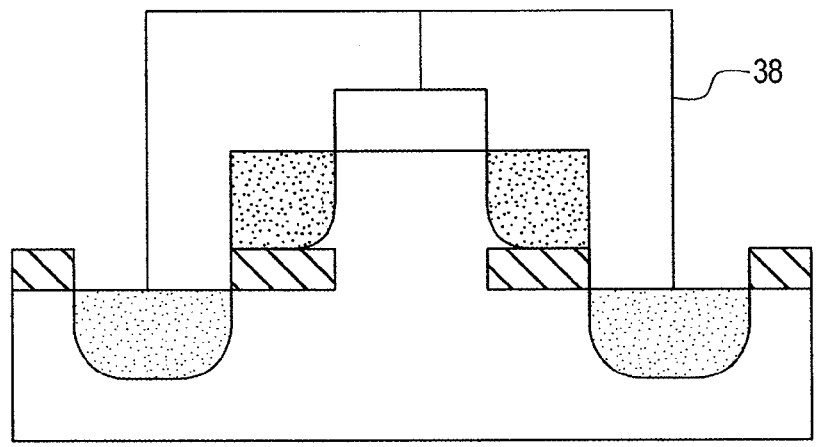

Referring to FIG. 3g, a connection part 38, which connects the P-type regions of the two photodiodes positioned under the lateral faces of the transistor comprising the source and drain regions and the gate electrode to the gate electrode 36, is completed. Electrons created in the two photodiodes move along the active silicon passage 33 of the first predetermined region and to the channel region under the gate electrode 36. The connection part 38 functions as a path so that holes excited by light irradiation move to the gate electrode 36.

In addition, after the completion of the connection part 38, a light shield screen 40 may be provided over the transistor to prevent light from being irradiated on the region except for the two photodiodes. The light shield screen 40 is preferably made of Al.

Figure 3H:
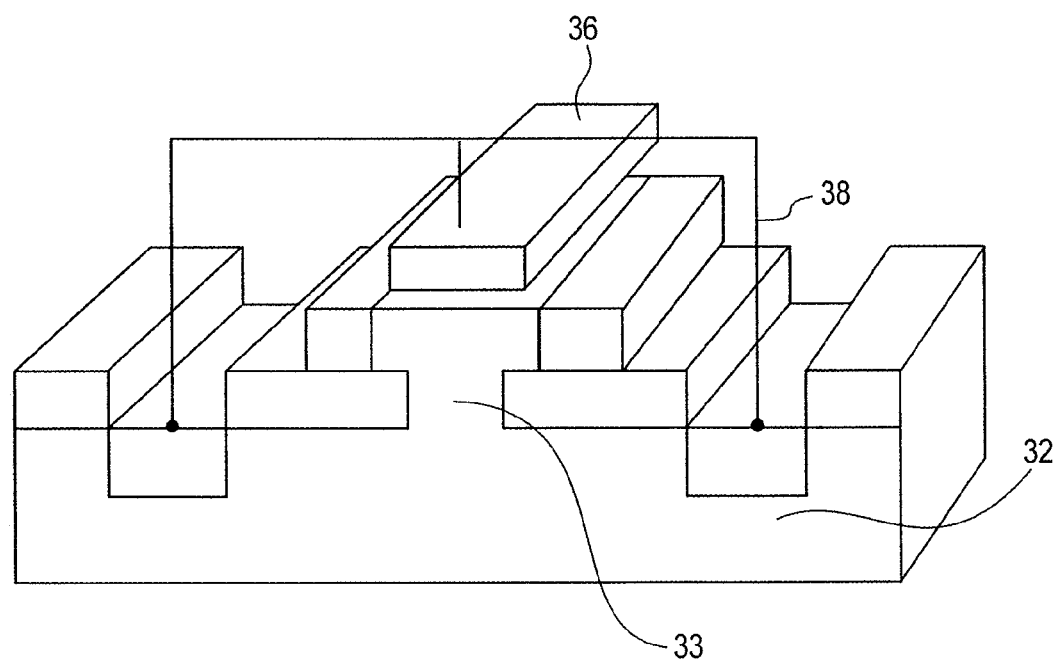
FIG. 3h illustrates the structure of a high-sensitivity image sensor in accordance with the present invention.

Referring to FIG. 3h, the two photodiodes are shown, having the PN junctions between the P-type regions 35 and the second region of the N-type silicon substrate 32. The active silicon passage 33 of the first region, which connects the N-type silicon substrate to the channel region of a floating body, is shown. The floating body comprises the source and drain regions, and the channel region. The gate electrode 36 is positioned on the channel region of the floating body. The two photodiodes and the gate electrode 36 are tied by the connection part 38.

Figure 3I:
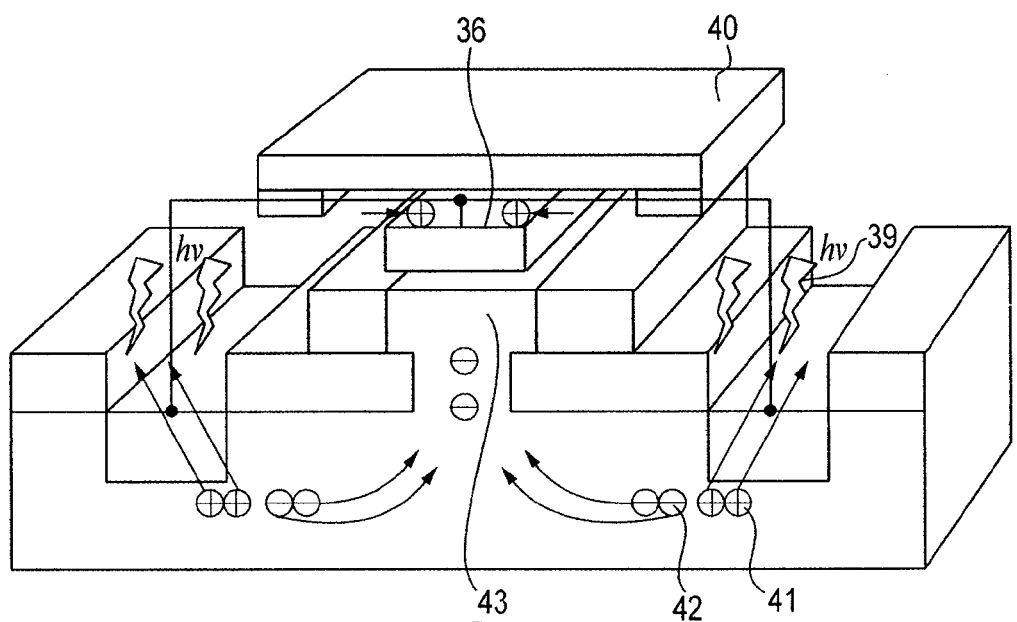
FIG. 3i is a cross-sectional view illustrating the operation principle of a high-sensitivity image sensor in accordance with the present invention.

FIG. 3i is a cross-sectional view illustrating the operation principle of a high-sensitivity image sensor in accordance with the present invention. Light irradiation 39 is conducted on the photodiode regions. The light shield screen 40 is provided over the transistor to prevent light from being irradiated on the region except for the two photodiodes. Electron-hole pairs are created in the photodiodes by the light irradiation. The holes 41 move along the P-type regions of the photodiodes and the connection part, so that the holes are accumulated in the gate electrode 36. The electrons 42 move along the N-type substrate and the active silicon passage 33 of the first region, and are accumulated in the channel region of the floating body. Much more electrons and hole are easily accumulated in the channel region of the floating body and the gate electrode 36 by interaction of a FET between the electrons and the holes. Moreover, since the body potential of the FET is increased by the accumulation of the holes and the electrons, the threshold voltage of the FET is decreased, so that a photo-current is increased.

Accordingly, the electrons and the holes induce the photo-current between the source and drain regions to increase. Furthermore, as a PNP LBT is constructed by the source and drain regions, and the channel region in which many electrons are accumulated, so that more linear photo-current is generated.

Figure 4A:
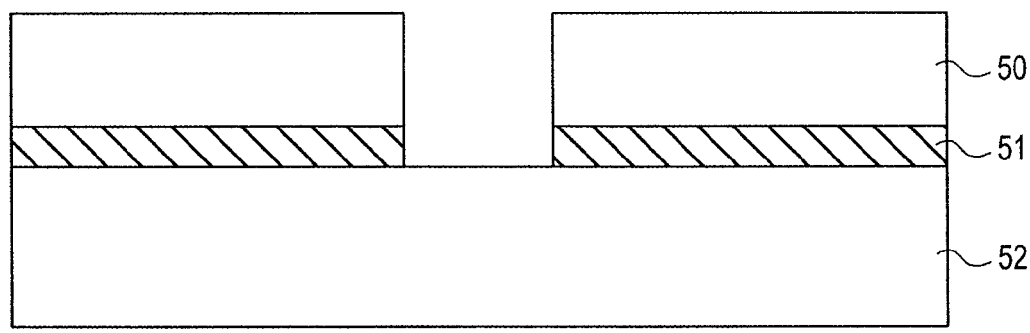
FIGS. 4a through 4g are cross-sectional views illustrating the third example process of fabricating a high-sensitivity image sensor in accordance with the present invention.

As the third example, referring to FIG. 4a, a first region 50 of active silicon 50 and a buried oxide layer 51 are etched by using a mask over an SOI substrate to expose an N-type silicon substrate 52. The SOI substrate can be manufactured according to various kind of fabrication methods. Particularly, the SOI substrate manufactured by an SIMOX method has a characteristic that the active silicon on the buried oxide layer is monocrystalline.

Figure 4B:
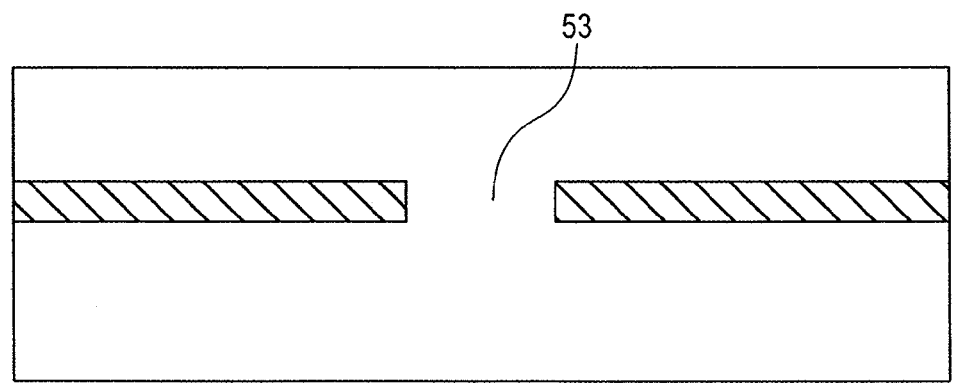

Referring to FIG. 4b, the exposed N-type silicon substrate is grown to form an active silicon passage 53 that connects the N-type silicon to active silicon on the buried oxide layer. The active silicon passage 53 of the active silicon is grown with a doping concentration equal to that of the N-type silicon substrate.

Figure 4C:
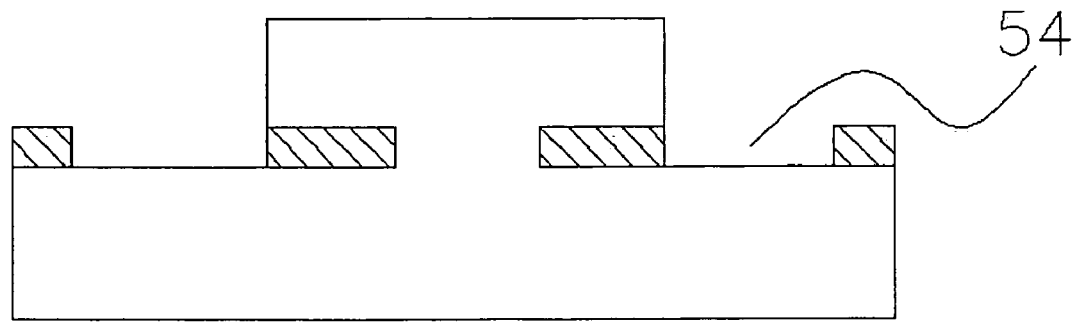

Referring to FIG. 4c, a second region 54 of the active silicon 50 and the buried oxide layer 51 at a distance to the first region 50 are etched to expose the N-type silicon substrate. The second region 54 is etched so that a sufficient area of a photodiode is obtained.

Figure 4D:
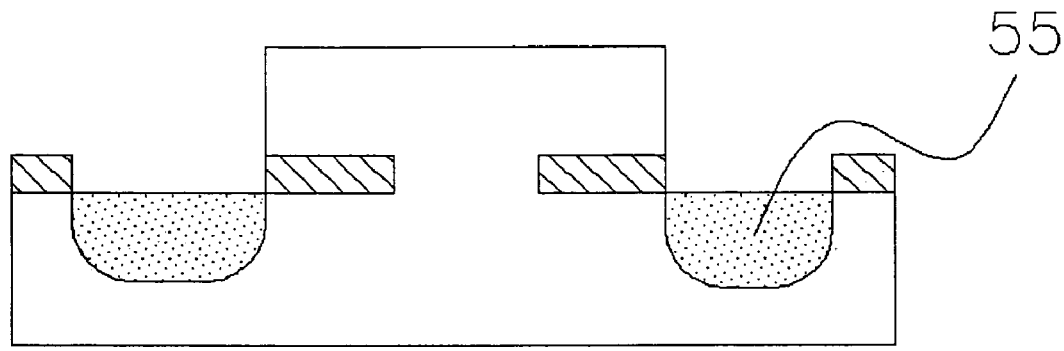

Referring to FIG. 4d, P-type ions are implanted into the second region 54 of the exposed N-type silicon substrate to form P-type regions 55, so that PN junctions are completed. Two photodiodes are defined by the PN junctions. The ion implantation is conducted to a sufficient depth for ensuring that irradiated light is converted to photoelectrons as much as possible. In addition, the shape of the photodiode is preferably buried-type so that a dark current can be minimized.

Figure 4E:
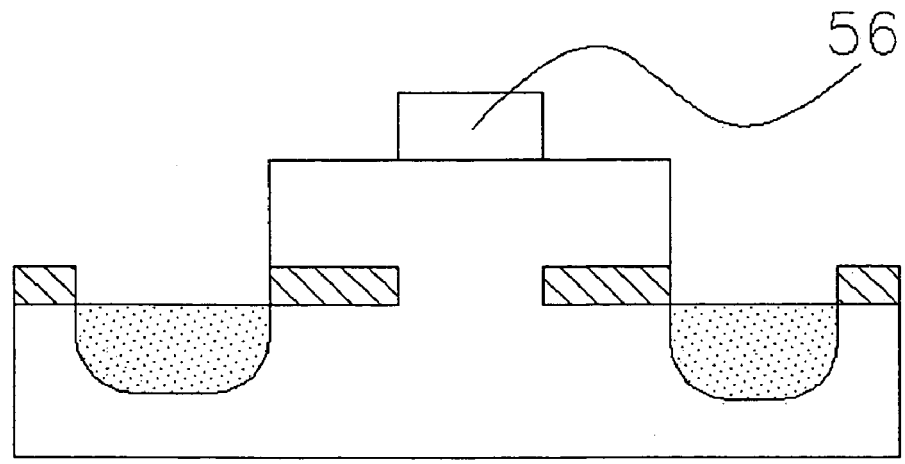

Referring to FIG. 4e, after a gate oxide layer and a silicon layer for a gate electrode are sequentially provided over the active silicon passage 53, the gate electrode 56 is completed by etching the gate oxide layer and the silicon layer.

Figure 4F:
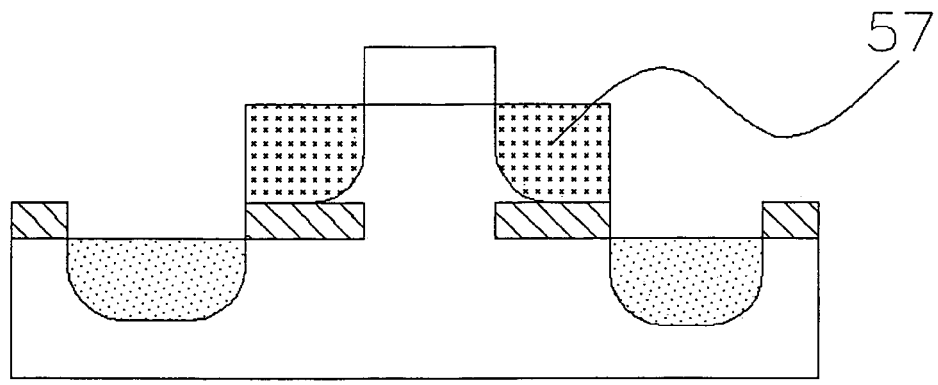

Referring to FIG. 4f, source and drain regions 57 are formed by implanting P-type ions into regions under the lateral faces of the gate electrode 56. At the same time, a region under the gate electrode between the source and drain regions is defined as a channel region. When a pattern for the ion implantation is constructed, the regions for the gate electrode, and the source and drain regions are exposed. However, the region for the gate electrode may be not exposed.

Figure 4G:
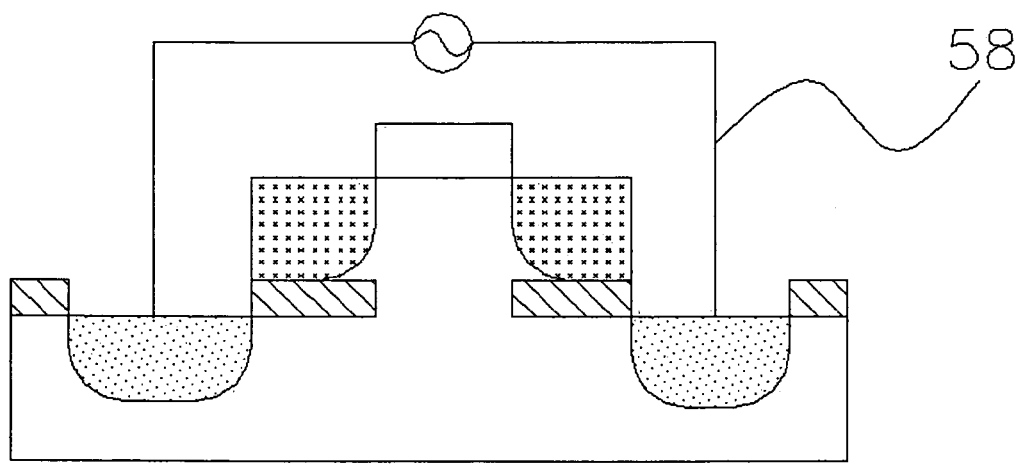

Referring to FIG. 4g, a connection part 58, which connects the P-type regions of the two photodiodes to AC voltage, is completed so that AC voltage is applied to the P-type regions of the two photodiodes. Owing to the connection part 58, electrons created in the two photodiodes easily move to the channel region under the gate electrode 56 along the active silicon passage 53 of the first region.

In addition, after the completion of the connection part 58, a light shield screen 60 may be provided over a transistor, which comprises the source and drain regions, and the gate electrode, to prevent light from being irradiated on the region except for the two photodiodes. The light shield screen 60 is preferably made of Al.

Figure 4H:
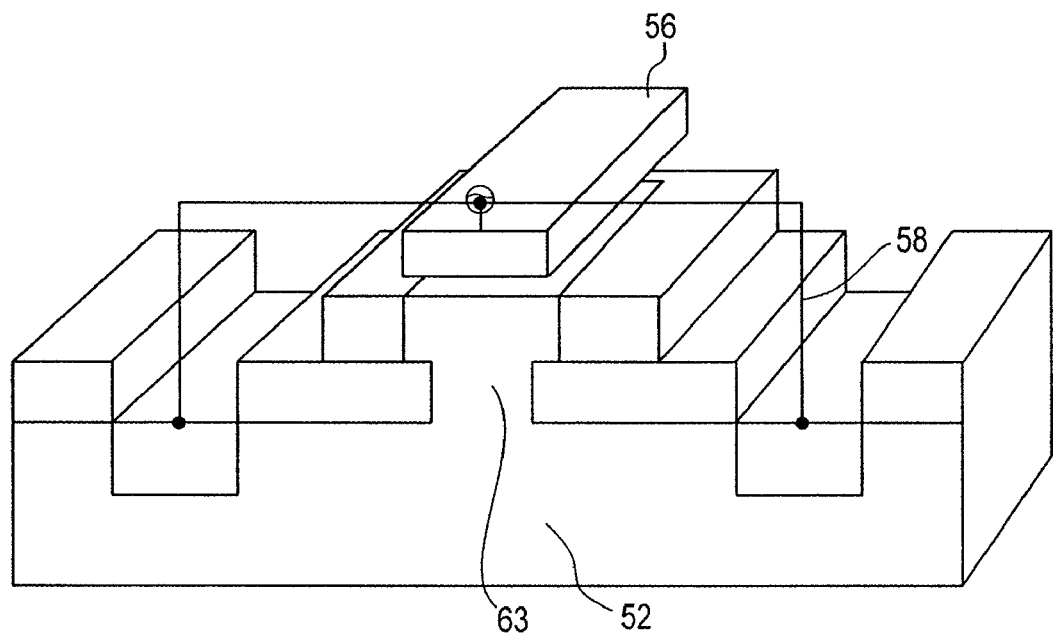
FIG. 4h illustrates the structure of a high-sensitivity image sensor in accordance with the present invention.

Referring to FIG. 4h, the two photodiodes are shown, having the PN junctions between the P-type regions 55 and the second region of the N-type silicon substrate 52 of the second region. The active silicon passage 53 of the first region, which connects the N-type silicon substrate to the channel region of a floating body, is shown. The floating body comprises the source and drain regions, and the channel region. A gate oxide layer and the gate electrode 56 are positioned on the channel region of the floating body. The connection part 58 is completed so that AC voltage is applied to the P-type regions of the two photodiodes.

Figure 4I:
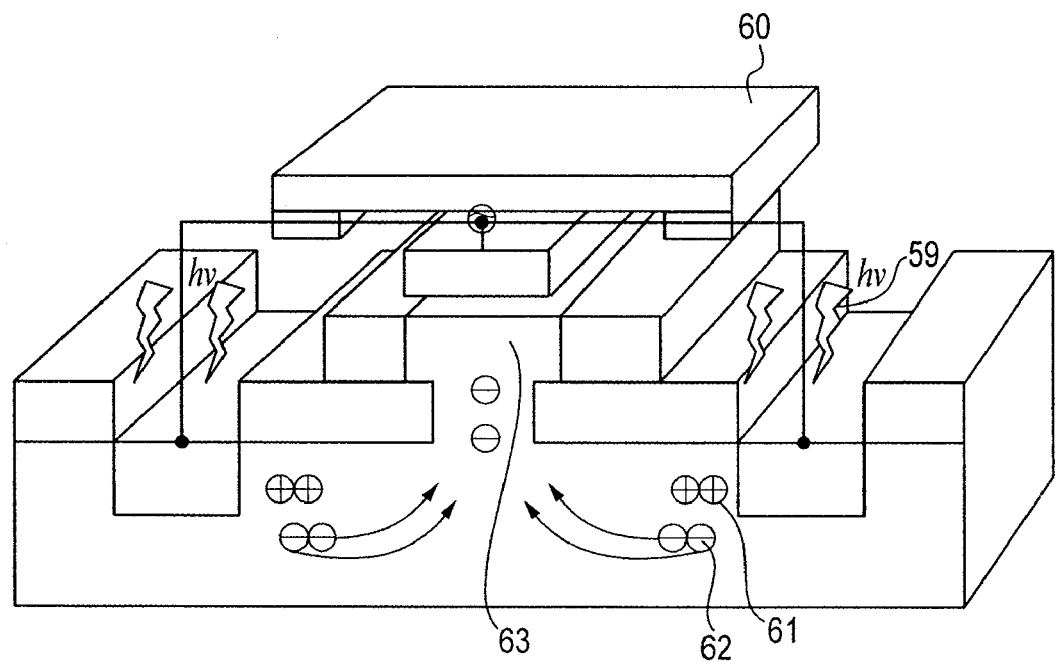
FIG. 4i is a cross-sectional view illustrating the operation principle of a high-sensitivity image sensor in accordance with the present invention.

FIG. 4i is a cross-sectional view illustrating the operation principle of a high-sensitivity image sensor in accordance with the present invention. Light irradiation 59 is conducted on the photodiode regions. The light shield screen 60 is provided over the transistor to prevent light from being irradiated on the region except for the two photodiodes. Electron-hole pairs are created in the photodiodes by the light irradiation. The holes 51 move along the P-type regions of the photodiodes. The electrons 62 move along the N-type substrate and the active silicon passage 53 of the first region, and are accumulated in the channel region of the floating body.

In detail, the electrons excited by light irradiation move to the N-type substrate. If AC voltage is applied to the P-type regions of the N-type silicon substrate, the electrons 62 move along the active silicon passage 53 of the first predetermined region, and are accumulated in the channel region of the floating body. The electrons accumulated in the channel region induce a photo-current between the source and drain regions to increase more and more. If light is intensively irradiated, a PNP LBT is constructed by the source and drain regions, and the channel region in which many electrons are accumulated, so that more linear photo-current is generated.

Accordingly, the disclosed method using the SOI substrate reduces a sensor size and a noise, and embodies the sensor that sensitively responses to a little amount of light.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a high-sensitivity image sensor comprising:
   etching predetermined regions of active silicon and a buried oxide layer of a SOI substrate by using a mask to expose an N-type silicon substrate;
   implanting P-type ions into the exposed N-type silicon substrate to form P-type regions;
   forming a gate oxide layer and a gate electrode on the middle part of the active silicon not etched while the active silicon is etched to expose the N-type silicon substrate;
   forming a P-type gate electrode, and P-type source and drain regions by implanting P-type ions into the active silicon and the gate electrode above the buried oxide layer; and
   constructing a connection part to connect the P-type regions to the gate electrode.

2. A method as defined by claim 1, further comprising forming a light shield screen over the active silicon and the gate electrode after the formation of the connection part.

3. A method as defined by claim 2, wherein the light shield screen is made of aluminum.

4. A method as defined by claim 1, wherein the gate oxide layer and the gate electrode are formed on the middle part of the active silicon by sequentially depositing a gate oxide layer and a silicon layer, and patterning and etching the gate oxide layer and the silicon layer.

5. A method as defined by claim 1, wherein a channel region is defined under the gate electrode between the source and drain regions.

* * * * *